(12) United States Patent
Shill

(10) Patent No.: US 9,397,688 B2
(45) Date of Patent: Jul. 19, 2016

(54) HYBRID DIGITAL-TO-ANALOG CONVERSION SYSTEM

(71) Applicant: TEXAS INSTRUMENTS INCORPORATED, Dallas, TX (US)

(72) Inventor: Mark Allan Shill, Tucson, AZ (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/848,779

(22) Filed: Sep. 9, 2015

(65) Prior Publication Data

US 2016/0072519 A1    Mar. 10, 2016

Related U.S. Application Data

(60) Provisional application No. 62/048,401, filed on Sep. 10, 2014.

(51) Int. Cl.
    *H03M 1/78*      (2006.01)

(52) U.S. Cl.
    CPC ..................... *H03M 1/785* (2013.01)

(58) Field of Classification Search
    CPC .......... H03M 1/785; H03M 1/66; H03M 1/78
    USPC .................................. 341/144, 154
    See application file for complete search history.

(56) References Cited

U.S. PATENT DOCUMENTS

| 4,338,591 A | 7/1982 | Tuthill |
| 6,448,917 B1 | 9/2002 | Leung et al. |
| 7,046,182 B1 | 5/2006 | Ja et al. |

| 2013/0293405 A1* | 11/2013 | Medina Sanchez-Castro .... H03M 1/785 341/154 |
| 2014/0266835 A1* | 9/2014 | Price ..................... H03M 1/808 341/145 |
| 2014/0347202 A1* | 11/2014 | Price ..................... H03M 1/808 341/145 |

FOREIGN PATENT DOCUMENTS

| EP | 0414593 | 2/1991 |
| JP | H01265724 | 10/1989 |
| WO | WO2008055139 | 5/2008 |

OTHER PUBLICATIONS

PCT International Search Report for corresponding PCT Application No. PCT/US2015/049480, dated Jan. 28, 2016.

* cited by examiner

*Primary Examiner* — Jean B Jeanglaude
(74) *Attorney, Agent, or Firm* — Daniel Chan; Frank D. Cimino

(57) ABSTRACT

A digital-to-analog conversion (DAC) circuit has a resistor ladder circuit controlled by high order bits and a resistor string circuit controlled by low order bits. The resistor ladder circuit includes a stem resistor and a branch resistor. The stem resistor has a stem resistance, and the branch resistor has a branch resistance that is substantially equal to two times of the stem resistance. The resistor string circuit includes a string current source, a string resistor, and a bridge resistor. The string current source is configured to generate a string current that is based on a ratio of a reference voltage divided by a predetermined resistance. The string resistor has a string resistance that corresponds to the predetermined resistance, and it is configured to selectively receive the string current based on a selection signal decoded from the low order bits.

20 Claims, 2 Drawing Sheets

HYBRID DIGITAL-TO-ANALOG CONVERSION SYSTEM

CROSS REFERENCE TO RELATED APPLICATIONS

Under 35 U.S.C. §119(e), this application claims the benefit of and priority to U.S. Provisional Application 62/048,401 filed Sep. 10, 2014, the entirety of which is incorporated herein by reference.

BACKGROUND

Digital-to-analog conversion (DAC) circuits are used for converting digital signals into analog signals. Generally, a DAC circuit may adopt either a string configuration or a ladder configuration. A DAC circuit adopting the string configuration tends to be space efficient and power efficient, but it is more susceptible to the distortion caused by process mismatch. By contrast, a DAC circuit adopting the ladder configuration tends to be less sensitive to process mismatch, but it comes with the cost of increased layout areas and power consumption.

Attempts have been made in the past to combine the string configuration with the ladder configuration. These combinations generally involve a voltage driven string circuit followed by a ladder circuit. Because the string circuit is driven by a constant voltage source, the string circuit needs additional output buffers to minimize integral non-linearity (INL) errors and differential non-linearity (DNL) errors. The additional output buffers increase the power consumption and layout size of the overall DAC circuit. In a DAC system that implements multiple conversion channels, the cost of including the additional output buffers can be prohibitively high. Thus, there is a need for a DAC system that provides high precision but without incurring the cost of additional output buffers.

SUMMARY

The present disclosure describes systems and techniques relating to a digital-to-analog conversion (DAC) architecture that provide high volume and high precision DAC performance but without incurring the cost of additional output buffers. More specifically, the disclosed DAC architecture includes one or more current sources for improving the reliability of a resistor string and for mitigating the process mismatch in a resistor ladder.

In one implementation, for example, the disclosed architecture includes a DAC circuit with a string current source, a resistor string, a string switch circuit, and a bridge resistor. The string current source is configured to generate a string current based on a ratio of a reference voltage divided by a predetermined resistance. The string current source has a string current output lead to deliver the string current. The resistor string has a string resistor that is coupled across a high string node and a low string node. The string resistor has a string resistance that is based on the predetermined resistance. The string switch circuit is coupled to the string current output lead so that the string switch circuit is configured to selectively deliver the string current to the string resistor based on a digital input signal. The bridge resistor is coupled between the high string node of the resistor string and a string output node outside of the resistor string, and the bridge resistor has a bridge resistance based on the string resistance.

In another implementation, for example, the disclosed architecture includes a DAC circuit with an input, a resistor ladder circuit, and a resistor string circuit. The input is configured to receive a digital signal having high order bits and low order bits. The resistor ladder circuit is controlled by the high order bits, and it includes a stem resistor and a branch resistor. The stem resistor has a stem resistance, and the branch resistor has a branch resistance that is substantially equal to two times of the stem resistance. The resistor string circuit is controlled by the low order bits, and it includes a string current source, a string resistor, and a bridge resistor. The string current source is configured to generate a string current that is based on a ratio of a reference voltage divided by a predetermined resistance. The string resistor has a string resistance that corresponds to the predetermined resistance, and the string resistor is configured to selectively receive the string current based on a selection signal decoded from the low order bits. The bridge resistor is coupled between the string resistor and the stem resistor, and the bridge resistor has a bridge resistance that is based on the string resistance and the predetermined resistance.

In yet another implementation, for example, the disclosed architecture includes a DAC circuit with an input, a resistor ladder circuit, and a resistor string circuit. The input is configured to receive a digital signal having m high order bits and n low order bits where m includes a first positive integer and n includes a second positive integer. The resistor ladder circuit is controlled by the high order bits, and it includes a stem resistor and a branch resistor. The stem resistor has a stem resistance, and the branch resistor has a branch resistance that is substantially equal to two times of the stem resistance. The resistor string circuit is controlled by the low order bits, and it includes a string current source, a string resistor, and a string switch circuit. The string current source is configured to generate a string current that is based on a ratio of a reference voltage divided by the branch resistance. The resistor string includes $2^n$ tap nodes and $2^n-1$ string resistors coupled between successive tap nodes. Each string resistor has a unit resistance that is substantially equal to a $\frac{1}{2}^n$ fraction of the branch resistance. The string switch circuit is configured to selectively deliver the string current to one of the tap nodes based on a decoded value of the low order bits.

DRAWING DESCRIPTIONS

Like reference symbols in the various drawings indicate like elements. Details of one or more implementations of the present disclosure are set forth in the accompanying drawings and the description below. The figures are not drawn to scale and they are provided merely to illustrate the disclosure. Specific details, relationships, and methods are set forth to provide an understanding of the disclosure. Other features and advantages may be apparent from the description and drawings, and from the claims.

DETAILED DESCRIPTION

Figure 1:
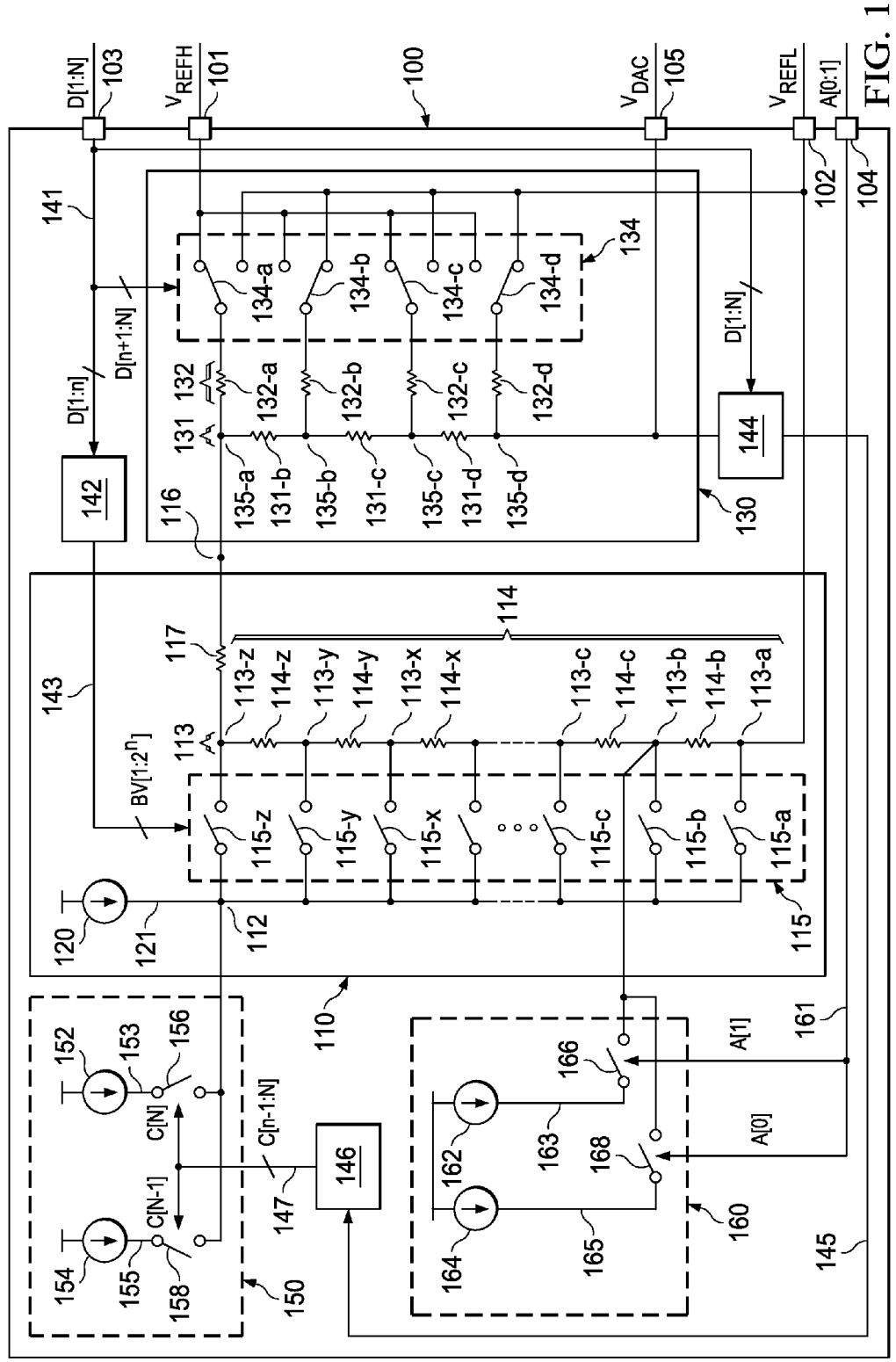
FIG. 1 shows a schematic view of an exemplary digital-to-analog conversion (DAC) system according to an aspect of the present disclosure.

FIG. 1 shows a schematic view of an exemplary digital-to-analog conversion (DAC) system 100 according to an aspect of the present disclosure. The DAC system 100 is used for converting a digital input with a certain number of bits to an analog output. The DAC system 100 can be implemented by an integrated circuit as a standalone module or in combination with other modules. Because the DAC system 100 is power efficient and space efficient, it can be recursively invoked to implement a multi-channel DAC system. In one implementation, for instance, an integrated circuit may incorporate four DAC systems 100 to form a quad 16-bit DAC system in a 3×3 quad-flat no-lead (QFN) package.

The periphery of the DAC system 100 includes a high reference input port 101, a low reference input port 102, a digital input port 103, an auxiliary digital input port 104, and a DAC output port 105. The high reference input port 101 is configured to receive a high reference signal, such as a $V_{REFH}$ signal. The low reference input port 102 is configured to receive a low reference signal, such as a $V_{REFL}$ signal. The potential difference between the $V_{REFH}$ signal and the $V_{REFL}$ signal provides a reference voltage ($V_{REF}$) across the internal circuitry of the DAC system 100. The reference voltage ($V_{REF}$) enables the DAC system 100 to generate an analog output according to a reference framework.

The digital input port 103 is configured to receive a digital signal 141. The digital signal 141 may include N binary bits of information (i.e., D[1:N]). Among these N binary bits, the DAC system 100 may designate a portion thereof as low order bits and the remaining portion as high order bits. As an example, the DAC system 100 may designate n of the least significant bits (LSBs) (e.g., D[1:n]) as the low order bits and m of the last most significant bits (MSBs) (e.g., D[(N−m+1): N]) as the high order bits, where the numbers n and m are both positive integers. In a configuration where the sum of m and n equals N, the number of high order bits (m) can be expressed as the difference between the total number of bits and the number of low order bits (i.e., N−n). Thus, the high order bits includes all the binary bits not included as low order bits. In that case, the low order bits can be the first n bits of the digital signal 141 (i.e., D[1:n]), whereas the high order bits can be the remaining bits of the digital signal 141 (i.e., D[(n+1):N]).

The auxiliary digital input port 104 is configured to receive an auxiliary digital input signal 161. The auxiliary digital input signal 161 serves to supplement the digital input signal 141. For example, if the digital input signal 141 includes N bits of information, the DAC system 100 may expand the conversion bandwidth by accepting $N_A$ auxiliary bits (e.g., A[0:1]) of the auxiliary digital signal 161. Accordingly, the DAC system 100 is configured to convert a total number of $N+N_A$ bits of information to an analog signal. In one implementation, the DAC system 100 may designate the auxiliary bits as the least significant bits trailing the low order bits (e.g., D[1:n]).

The internal circuitry of the DAC system 100 adopts a hybrid DAC architecture that includes a resistor string circuit 110 and a resistor ladder circuit 130. To minimize INL errors, the resistor string circuit 110 is configured to convert the low order bits (e.g., D[1:n]), whereas the resistor ladder circuit 130 is configured to convert the high order bits (e.g., D[(n−1):N]). Thus, the resistor ladder circuit 130 is controlled by the high order bits. The resistor ladder circuit 130 generally includes a stem resistor 131, a branch resistor 132, and a ladder switch circuit 134. The stem resistor 131 may have a stem resistance (R), whereas the branch resistor 132 may have a branch resistance that is twice the value of the stem resistance (2R). Because of this 1-to-2 resistance ratio, the resistor ladder circuit 130 is understood to implement an R2R (i.e., R of the stem resistor and 2R of the branch resistor) ladder configuration. The ladder switch circuit 134 is coupled with the branch resistor 132 and controlled by the high order bits (e.g., D[(n+1):N]). Based on the value of the high order bits, the ladder switch circuit 134 selectively connects the branch resistor 132 to either the high reference voltage (e.g., $V_{REFH}$) or the ground reference voltage (e.g., $V_{REFL}$).

To convert more than one high order bit, the resistor ladder circuit 134 includes more than one stem resistor 131 and more than one branch resistor 132. Also, the ladder switch circuit 134 includes multiple ladder switches 134, each of which is controlled by one of the high order bits for connecting one corresponding branch resistor 132 to either the reference high voltage ($V_{REFH}$) or the reference ground voltage ($V_{REFL}$). In one implementation, for example, the resistor ladder circuit 134 may include four branch resistors (e.g., 132-a, 132-b, 132-c, and 132-d) for converting four high order bits. Each of the branch resistors (e.g., 132-b, 132-c, and 132-d) corresponds to a stem resistor (e.g., 131-b, 131-c, and 131-d) on the one hand and a ladder switch (e.g., 134-b, 134-c, and 134-d) on the other hand. The least significant branch resistor 132-a corresponds to a terminal resistor having a resistance of 2R on the one hand and the ladder switch 134-a on the other hand. The DAC system 100 adapts the resistor string circuit 110 as the terminal resistor of the resistor ladder circuit 130.

The first branch resistor 132-a is connected to the resistor string circuit 110 via a first branch node 135-a. The resistor string circuit 110 serves as a terminal resistor to the branch resistor 132-a because the resistor string circuit 110 provides a ground path for the resistor ladder circuit 130 and because the equivalent resistance of the resistor string circuit 110 is about 2R. The first branch resistor 132-a is also connected to the first ladder switch 134-a, which is controlled by the fourth high order bit (e.g., D[N−3]). When the fourth high order bit is in an active stage (e.g., D[N−3] has a high digital value), the first ladder switch 134-a connects the first branch resistor 132-a to the high reference voltage (e.g., $V_{REFH}$). As a result, the voltage of the first branch node 135-a is charged up by the high reference voltage, and the aggregated voltage of the DAC output ($V_{DAC}$) is increased. By contrary, when the fourth high order bit is in an inactive stage (e.g., D[N−3] has a low digital value), the first ladder switch 134-a connects the first branch resistor 132-a to the ground reference voltage (e.g., $V_{REFL}$). As a result, the voltage of the first branch node 135-a is discharged by the ground reference voltage, and the aggregated voltage of the DAC output ($V_{DAC}$) is decreased. In general, the change of voltage introduced by the first ladder switch 134-a has a weighted influence on the aggregated voltage of the DAC output ($V_{DAC}$). This weighted influence is based on the relative bit position of the fourth high order bit (e.g., D[N−3]). For instance, when N is 16 such that N−3 equals 13, the exponential weight of the voltage change associated with the first branch resistor 132-a is approximately $2^{(12-N)}$.

The second branch resistor 132-b is connected to the second stem resistor 131-b via a second branch node 135-b. The second stem resistor 131-b is connected to the first branch node 135-a such that the voltage at the second branch node 135-b is aggregates on the voltage of the first branch node 135-a. The second branch resistor 132-b is also connected to the second ladder switch 134-b, which is controlled by the third high order bit (e.g., D[N−2]). When the third high order bit is in an active stage (e.g., D[N−2] has a high digital value), the second ladder switch 134-b connects the second branch resistor 132-b to the high reference voltage (e.g., $V_{REFH}$). As a result, the voltage of the second branch node 135-b is charged up by the high reference voltage, and the aggregated voltage of the DAC output ($V_{DAC}$) is increased. By contrary, when the third high order bit is in an inactive stage (e.g., D[N−2] has a low digital value), the second ladder switch 134-b connects the second branch resistor 132-b to the ground reference voltage (e.g., $V_{REFL}$). As a result, the voltage of the second branch node 135-b is discharged by the ground reference voltage, and the aggregated voltage of the DAC output ($V_{DAC}$) is decreased. In general, the change of voltage introduced by the second ladder switch 134-b has a weighted influence on the aggregated voltage of the DAC output ($V_{DAC}$). This weighted influence is based on the relative bit position of the third high order bit (e.g., D[N−2]). For instance, when N is 16 such that N−2 equals 14, the exponential weight of the voltage change associated with the second branch resistor 132-b is approximately $2^{(13-N)}$.

The third branch resistor 132-c is connected to the third stem resistor 131-c via a third branch node 135-c. The third stem resistor 131-b is connected to the second branch node 135-b such that the voltage at the third branch node 135-c aggregates on the voltage of the second branch node 135-b. The third branch resistor 132-c is also connected to the third ladder switch 134-c, which is controlled by the second high order bit (e.g., D[N−1]). When the second high order bit is in an active stage (e.g., D[N−1] has a high digital value), the third ladder switch 134-c connects the third branch resistor 132-c to the high reference voltage (e.g., $V_{REFH}$). As a result, the voltage of the third branch node 135-c is charged up by the high reference voltage, and the aggregated voltage of the DAC output ($V_{DAC}$) is increased. By contrary, when the second high order bit is in an inactive stage (e.g., D[N−1] has a low digital value), the third ladder switch 134-c connects the third branch resistor 132-c to the ground reference voltage (e.g., $V_{REFL}$). As a result, the voltage of the third branch node 135-c is discharged by the ground reference voltage, and the aggregated voltage of the DAC output ($V_{DAC}$) is decreased. In general, the change of voltage introduced by the third ladder switch 134-c has a weighted influence on the aggregated voltage of the DAC output ($V_{DAC}$). This weighted influence is based on the relative bit position of the second high order bit (e.g., D[N−1]). For instance, when N is 16 such that N−1 equals 15, the exponential weight of the voltage change associated with the third branch resistor 132-c is approximately $2^{(14-N)}$.

The fourth branch resistor 132-d is connected to the fourth stem resistor 131-d via a fourth branch node 135-d. The fourth stem resistor 131-d is connected to the third branch node 135-c such that the voltage at the fourth branch node 135-d aggregates on the voltage of the third branch node 135-c. The fourth branch resistor 132-d is also connected to the fourth ladder switch 134-d, which is controlled by the first high order bit (e.g., D[N]). When the first high order bit is in an active stage (e.g., D[N] has a high digital value), the fourth ladder switch 134-d connects the fourth branch resistor 132-d to the high reference voltage (e.g., $V_{REFH}$). As a result, the voltage of the fourth branch node 135-d is charged up by the high reference voltage, and the aggregated voltage of the DAC output ($V_{DAC}$) is increased. By contrary, when the first high order bit is in an inactive stage (e.g., D[N] has a low digital value), the fourth ladder switch 134-d connects the fourth branch resistor 132-d to the ground reference voltage (e.g., $V_{REFL}$). As a result, the voltage of the fourth branch node 135-d is discharged by the ground reference voltage, and the aggregated voltage of the DAC output ($V_{DAC}$) is decreased. In general, the change of voltage introduced by the fourth ladder switch 134-d has a weighted influence on the aggregated voltage of the DAC output ($V_{DAC}$). This weighted influence is based on the relative bit position of the first high order bit (e.g., D[N]). For instance, when N is 16, the exponential weight of the voltage change associated with the fourth branch resistor 132-d is approximately $2^{(15-N)}$.

The DAC system 100 includes a decoder circuit 142 that is configured to decode the low order bits (e.g., D[1:n]) and to generate several selection signals 143. Each selection signal 143 represents a particular binary combination of the low order bits. For instance, if n is the total number of low order bits, then the low order bits may have $2^n$ combinations, and thus the low order bits can be decoded into $2^n$ selection signals 143 (e.g., BV[1:$2^n$]). More specifically, the first selection signal BV[1] may represent the first binary combination of the low order bits in which each bit has a zero value, and the nth selection signal BV[n] may represent the nth combination of the low order bits in which each bit has a non-zero value.

The resistor string circuit 110 is connected to the decoder circuit 142, such that the resistor string circuit 110 is configured to receive the selection signals 143. The resistor string circuit 110 is controlled by the decoded value of the low order bits to generate a string output voltage ($V_{STRING}$) at a string output node 116. The string output voltage ($V_{STRING}$) is received by the resistor ladder circuit 130, and it also has a weighted influence on the DAC output voltage ($V_{DAC}$) according to the exponential weight of a particular set of low order bits. Thus, the DAC system 100 implements a hybrid DAC architecture in which the resistor ladder circuit (e.g., a R2R ladder) 130 is used for converting high order bits (e.g., MSBs) and the resistor string circuit 110 is used for converting low order bits (e.g., LSBs).

The disclosed hybrid architecture minimizes the integral non-linear (INL) errors of a standalone string DAC as the resistor ladder circuit 130 has a larger bit weight to help suppress the noise in the standalone string DAC. Moreover, the disclosed hybrid architecture reduces the overall layout area of a standalone ladder DAC because the resistor string circuit 110 generally takes up less space for converting the same number of bits than the standalone ladder DAC. To that end, the disclosed hybrid architecture is less dependent on the high order bits (i.e., code dependency) that drive the operational current (i.e., IQ current from $V_{REFH}$ to $V_{REFL}$ via the R2R ladder) of the standalone ladder DAC. The reduction of the code dependency improves the overall accuracy and reliability of the DAC system 100.

The resistor string circuit 110 includes a string current source 120, a series of tap nodes 113, a series of string resistors 114, a string switch circuit 115, and a bridge resistor 117. The string current source 120 is configured to generate a string current ($I_{STRING}$) that is based on a ratio of the reference voltage ($V_{REF}$) divided by a predetermined resistance (i.e., $V_{REF}/R_{PRED}$). The reference voltage ($V_{REF}$) can be defined in relative to the high reference voltage ($V_{REFH}$) and the ground reference voltage ($V_{REFL}$). In one implementation, for instance, the reference voltage ($V_{REF}$) can be the potential difference between the high reference voltage ($V_{REFH}$) and the ground reference voltage ($V_{REFL}$). In another implementation, for instance, the reference voltage ($V_{REF}$) is substantially the same as the high reference voltage ($V_{REFH}$) when the ground reference voltage ($V_{REFL}$) is kept at a relatively stable ground voltage.

The predetermined resistance ($R_{PRED}$) is a function of the branch resistance (2R) and the configuration of the string resistors 114. In general, the equivalent resistance of the resistor string circuit 110 as seen by the resistor ladder circuit 130 at the string output node 116 substantially equals to the branch resistance (2R) of a single branch resistor (e.g., 132-a, 132-b, 132-c, or 132-d). Thus, the total resistance of the resistor string 114 (i.e., the string resistors 114-b, 114-c, 114-x, 114-y, and 114-z connected in series) and the bridge resistor 117 as seen at the string output node 116 is configured and/or calibrated to meet the branch resistance (2R) value.

There are several ways to achieve this particular configuration. In one implementation, for instance, each of the string resistor 114 and the bridge resistor 117 has a unit resistance of $R*2^{-(n-1)}$ where n denotes the total number of low order bits. This unit resistance can be understood as a $2^{-n}$ fraction of the branch resistance (2R). Because the total number of string resistors 114 is based on the total number of decoded combination values (e.g., $BV[1:2^n]$) of the low order bits (e.g., D[1:n]), there are $2^n-1$ string resistors 114. Accordingly in this configuration, the total string resistance ($R_{STRING}$) substantially equals $\{2R-R*2^{-(n-1)}\}$. Because the bridge resistance ($R_{BRIDGE}$) of the bridge resistor 117 is also set at $R*2^{-(n-1)}$, the total resistance of the resistor string circuit 110 (i.e., the sum of the string resistance ($R_{STRING}$) and the bridge resistance ($R_{BRIDGE}$)) substantially equals the branch resistance (2R). Accordingly, the predetermined resistance ($R_{PRED}$) for configuring the string current source 120 is substantially equal to branch resistance (2R) or alternatively, the sum of the string resistance ($R_{STRING}$) and the bridge resistance ($R_{BRIDGE}$). In this configuration, the string current ($I_{STRING}$) is regulated at $V_{REF}/2R$.

In another implementation, for instance, the string resistors 114 has an operational string resistance ($R_{STRING\_OP}$) that is less than the branch resistance (2R), and the bridge resistor 117 has an adjustable bridge resistance ($R_{BRIDGE}$) such that the sum of the operational string resistance ($R_{STRING\_OP}$) and the bridge resistance ($R_{BRIDGE}$) still amounts to the branch resistance (2R). This implementation provides more flexibility than the previous one because the string resistors 114 may have a wider tolerance than the unit resistance of $R*2^{-(n-1)}$. That is, the operational string resistance ($R_{STRING\_OP}$) is not limited to a particular value so long as it is less than the branch resistance (2R). Because the total number of string resistors 114 in this implementation is based on the total number of decoded combination values (e.g., $BV[1:2^n]$) of the low order bits (e.g., D[1:n]), there are $2^n-1$ string resistors 114. Thus, the total string resistance ($R_{STRING}$) substantially equals $R_{STRING\_OP}*(1-2^{-n})$, and the bridge resistance ($R_{BRIDGE}$) substantially equals $\{2R-R_{STRING\_OP}*(1-2^{-n})\}$. Accordingly, the predetermined resistance ($R_{PRED}$) for configuring the string current source 120 is substantially equal to the operational string resistance ($R_{STRING\_OP}$). In this configuration, the string current ($I_{STRING}$) is regulated at $V_{REF}/R_{STRING\_OP}$.

The string current source 120 has a string current output lead 121 for delivering the string current ($I_{STRING}$). The string current output lead 121 is connected to the string switch circuit 115. Based on the selection signals 143, the string switch circuit 115 is configured to selectively deliver the string current ($I_{STRING}$) to a particular tap node 113 along the resistor string 114. The resistor string 114 includes multiple string resistors (e.g., 114-b to 114-z) connected in series with each other and in between tap nodes 113. As described above, the number of string resistors 114 corresponds to the number of low order bits decoded by the decoder circuit 142. In general, the resistor string 114 includes $2^n-1$ string resistors 114 where n is a positive integer denoting the number of low order bits. The string resistor (e.g., 114-b to 114-z) is coupled across a high string node 113-z and a low string node 113-a, which are the terminal tap nodes 113 of the resistor string 114. The number of tap nodes 113 also corresponds to the number of low order bits decoded by the decoder circuit 142. In general, the resistor string 114 includes $2^n$ tap nodes 113 where n is a positive integer denoting the number of low order bits. Each tap node 113 represents a string node onto which the string switch circuit 115 may tap in order to direct the string current ($I_{STRING}$) according to the selection signals 143.

When the first selection signal BV[1] is in an active state, the first string switch 115-a of the string switch circuit 115 is closed to connect the string current output lead 121 to a first tap node (i.e., the low string node) 113-a of the resistor string 114. When the second selection signal BV[2] is in an active state, the second string switch 115-b of the string switch circuit 115 is closed to connect the string current output lead 121 to a second tap node 113-b of the resistor string 114. When the third selection signal BV[3] is in an active state, the third string switch 115-c of the string switch circuit 115 is closed to connect the string current output lead 121 to a third tap node 113-c of the resistor string 114. Similarly, when the third last selection signal BV[n-2] is in an active state, the third last string switch 115-x of the string switch circuit 115 is closed to connect the string current output lead 121 to a third last tap node 113-x of the resistor string 114.

Upon being directed to a selected tap node 113, the string current ($I_{STRING}$) diverges into two currents: a high order current ($I_1$) that flows to the resistor ladder circuit 130 via an unselected segment of the resistor string 114 and a low order current ($I_2$) that flows to the low reference input port 102 via a selected segment of the resistor string 114. The selected segment of the resistor string 114 includes the string resistor(s) that is below a selected tap node 113, whereas the unselected segment of the resistor string 114 includes the string resistor(s) that is above the selected tap node 113. For example, assuming that the second tap node 113-b is selected, the selected segment includes the first string resistor 114-b, whereas the unselected segment includes the second string resistor 114-c, the third last string resistor 114-x, the second last string resistor 114-y, the last string resistor 114-z, as well as any other string resistors between the second string resistor 114-c and the third last string resistor 114-x.

Figure 2:
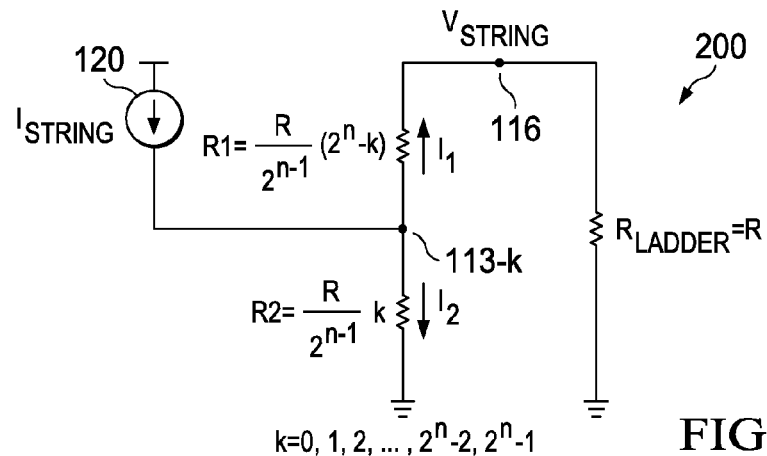
FIG. 2 shows a schematic view of a transfer function model of the exemplary DAC system according to an aspect of the present disclosure.

To further illustrate the switched current source operation of the resistor string circuit 110, FIG. 2 shows a schematic view of a transfer function model 200 of the resistor string circuit 110 in conjunction with the resistor ladder circuit 130. The transfer function model 200 includes the string current source 120, an unselected segment R1 of the resistor string 114 and the bridge resistor 117, a selected segment R2 of the resistor string 114, and an equivalent ladder resistance ($R_{LADDER}$). The transfer function model 200 assumes that the ladder switch circuit 134 has an all-zero configuration at one point. This assumption provides a foundation for a baseline analysis of the switched current source operation (i.e., the operations of the current source 120 in conjunction with the switch circuit 115). When each ladder switch 134 directs each branch resistor 132 to the ground reference voltage ($V_{REFL}$), the equivalent resistance of the resistor ladder circuit 130 equals the stem resistance or half of the branch resistance (R).

The selected tap node 113-k represents a tap node 113 that is coupled with the string current source 120 by the string switch circuit 115 (see FIG. 1). The selected tap node 113-k divides the resistor string 114 into a selected segment R2 between the selected tap node 113-k and the low string node 113-a on the one hand, and an unselected segment R1 between the high string node 113-z and the selected string node 113-k on the other hand. Thus, the unselected segment R1 has an equivalent resistance of $R*[2^n-k][2^{-(n-1)}]$, whereas the selected segment R2 has an equivalent resistance of $R*k*[2^{-(n-1)}]$. According to the node current principle, the string current ($I_{STRING}$) equals the sum of the high order current $I_1$ and the low order current $I_2$ (i.e., $I_{STRING}=I_1+I_2$).

Moreover, the potential of the selected tap node 114-k is a function of the parallel resistance through which the high order current $I_1$ and the low order current $I_2$ flow. Specifically, the low order current $I_2$ is configured to flow through the selected segment R2, whereas the high order current $I_1$ configured to flow through the unselected segment R1 and the resistor ladder circuit ($R_{LADDER}$). As such, the high order current $I_1$ can be expressed by Equations (1.1) to (1.6) below.

$$I_1 = \frac{R2}{R1 + R2 + R_{LADDER}} \quad \text{Eq. (1.1)}$$

$$I_1 = \frac{V_{REF}}{2R} * \frac{\frac{R}{2^{n-1}}k}{\frac{R}{2^{n-1}}(2^n - k) + \frac{R}{2^{n-1}}k + R} \quad \text{Eq. (1.2)}$$

$$I_1 = \frac{V_{REF}}{2R} * \frac{\frac{R}{2^{n-1}}k}{\frac{R}{2^{n-1}}2^n + R} \quad \text{Eq. (1.3)}$$

$$I_1 = \frac{V_{REF}}{2R} * \frac{k}{2^n + 2^{n-1}} \quad \text{Eq. (1.4)}$$

$$I_1 = \frac{V_{REF}}{2R} * \frac{k}{\frac{3}{2}(2^n)} \quad \text{Eq. (1.5)}$$

$$I_1 = \frac{V_{REF} * k}{3(2^n)R} \quad \text{Eq. (1.6)}$$

Based on the high order current $I_1$ and the resistor ladder ($R_{LADDER}$), the string output node 116 has a string voltage ($V_{STRING}$) that can be expressed by Equations (2.1) to (2.4) below.

$$V_{STRING} = I_1(R_{LADDER}) \quad \text{Eq. (2.1)}$$

$$V_{STRING} = \frac{V_{REF} * k}{3(2^n)} \quad \text{Eq. (2.2)}$$

$$V_{STRING} = \frac{1}{3} * \frac{V_{REF}}{2R} * R_2 \quad \text{Eq. (2.3)}$$

$$V_{STRING} = \frac{1}{3} I_{STRING} * R_2 \quad \text{Eq. (2.4)}$$

Accordingly, the string voltage $V_{STRING}$ is a function of the multiplication product between the string current ($I_{STRING}$) and the equivalent resistance of the selected segment R2. The constant value of one-third is based on the all-zero ladder DAC configuration, which will change when the high order bits change. Thus, when the string voltage ($V_{STRING}$) transfers to the DAC output node 105, the partial DAC voltage ($V_{DAC\_STRING}$) can be expressed by Equation (3.1) to (3.2) as a transfer function of the string voltage ($V_{STRING}$), where n denotes the resolution of the resistor string circuit 110, and m denotes the resolution of the resistor ladder circuit 130.

$$V_{DAC\_STRING} = \frac{3 * V_{STRING}}{2^m} \quad \text{Eq. (3.1)}$$

$$V_{DAC\_STRING} = \frac{V_{REF} * k}{2^{m+n}} \quad \text{Eq. (3.2)}$$

The transfer function of the ladder voltage ($V_{DAC\_LADDER}$) is based on the selected code j of the high order bits as expressed by Equation (4) below.

$$V_{DAC\_STRING} = \frac{V_{REF} * j}{2^m} \quad \text{Eq. (4)}$$

Thus, the total DAC voltage (VDAC) can be expressed by Equations (5.1) and (5.2) below.

$$V_{DAC} = V_{DAC\_LADDER} + V_{DAC\_STRING} \quad \text{Eq. (5.1)}$$

$$V_{DAC} = \frac{V_{REF} * j}{2^m} + \frac{V_{REF} * k}{2^{m+n}} \quad \text{Eq. (5.2)}$$

The DAC output voltage ($V_{DAC}$) is thus a function of the reference voltage ($V_{REF}$) and the binary exponentiation of the total bit number (i.e., $2^{m+n}$) of the high order bits and the low order bits. Thus, the binary exponentiation component of the DAC output voltage (VDAC) may advantageously reduce the INR errors of the string circuit 110 and the IQ current dependency of the ladder circuit 130. Because the lower string circuit 110 is combined directly with the upper ladder circuit 130, the overall DAC system 100 does not require any additional buffer circuit in between ladder DAC and the string DAC. Thus, the disclosed hybrid architecture may advantageously achieve smaller layout area and less power consumption than conventional DAC architectures.

Furthermore, because the string circuit 110 provides the low order bits conversion, the ladder circuit 130 may have a smaller number of ladder branches when compared with a standalone ladder DAC circuit. As a substitution, the string resistors are typically much smaller than the stem and branch resistors (i.e., 2R for n low order bits versus 3R for each high order bit). Thus, the disclosed hybrid architecture may advantageously reduce the layout area of the conventional ladder DAC circuit. Although FIG. 1 shows that the switched current source scheme of the resistor string circuit 110 is used in conjunction with the resistor ladder circuit 130, the disclosed resistor string circuit 110 may also be used with or in other types of DAC architectures.

Referring again to FIG. 1, the DAC system 100 may optionally include a DAC auxiliary circuit 160 to expand the low order bits conversion capability of the resistor string circuit 110. The DAC auxiliary circuit 160 is coupled with the auxiliary digital input port 104 to receive an auxiliary digital signal 161. The auxiliary digital signal 161 may include one or more auxiliary bits (e.g., A[0:1]), each of which has a lower bit weight than the low order bits (e.g., D[1:n]) of the digital signal 141. The DAC auxiliary circuit 160 serves as an interface between the auxiliary bits and the resistor string circuit 110.

In general, the DAC auxiliary circuit 160 includes a set of one auxiliary current source (e.g., 162 and/or 164) and one auxiliary switch (e.g., 166 and/or 168) for each auxiliary bit. Thus, to interface the auxiliary digital signal 161 with two auxiliary bits, the DAC auxiliary circuit 160 includes two sets of auxiliary current source (i.e., 162 and/or 164) and auxiliary switch (i.e., 166 and/or 168).

The first auxiliary current source 162 is configured to generate a first auxiliary current based on a first binary fraction of the string current. The first binary fraction corresponds to an exponential weight of the low order bit represented by the first auxiliary bit (e.g., A[0]) and a particular tap node 113 to which the first auxiliary current source 162 is coupled. The first auxiliary current source 162 includes a first auxiliary current output lead 163 to deliver the first auxiliary current. The first auxiliary switch 166 is coupled between the first auxiliary current output lead 163 and a particular tap node 113 of the resistor string 114. The first auxiliary switch 166 is controlled by the first auxiliary bit (e.g., A[0]) to selectively deliver the first auxiliary current to the string resistor 114.

Similarly, the second auxiliary current source 164 is configured to generate a second auxiliary current based on a second binary fraction of the string current. The second binary fraction corresponds to an exponential weight of the low order bit represented by the second auxiliary bit (e.g., A[1]) and a particular tap node 113 to which the second auxiliary current source 164 is coupled. The second auxiliary current source 164 includes a second auxiliary current output lead 165 to deliver the second auxiliary current. The second auxiliary switch 168 is coupled between the second auxiliary current output lead 165 and a particular tap node 113 of the resistor string 114. The second auxiliary switch 168 is controlled by the second auxiliary bit (e.g., A[1]) to selectively deliver the second auxiliary current to the string resistor 114.

In general, the binary fraction of a particular auxiliary current source can be defined as $2^{-(A+T)}$ where A denotes the bit position of the auxiliary bit in relative to the least low order bit (e.g., D[1]), and T denotes the connected tap node 114 above the first tap node 113-a. Thus, the auxiliary current ($I_{AUX}$) can be expressed as a scaled function of the string current (i.e., $I_{AUX}$=ISPRING*$2^{-(A+T)}$). For instance, the second auxiliary bit A[1] is one bit position less significant than the least low order bit (e.g., D[1]), so that the parameter A for the first binary is 1. Assuming the second auxiliary current source 164 is coupled to the first tap point 113-a, then the parameter T of the first binary fraction is 0. Thus, the binary fraction of the second auxiliary bit A[1] under this particular assumption will be $2^{-1}$ or a one-half fraction. Accordingly, the second auxiliary current source 164 is configured to generate a second auxiliary current ($I_{AUX1}$) substantially equals one-half of the string current ($I_{STRING}$).

Similarly, the first auxiliary bit A[0] is two bit position less significant than the least low order bit (e.g., D[1]), so that the parameter A for the first binary is 2. Assuming again the first auxiliary current source 162 is coupled to the first tap point 113-a, then the parameter T of the first binary fraction is also 0. Thus, the binary fraction of the first auxiliary bit A[0] under this particular assumption will be $2^{-2}$ or a one-fourth fraction. Accordingly, the first auxiliary current source 162 is configured to generate a first auxiliary current ($I_{AUX0}$) substantially equals one-fourth of the string current ($I_{STRING}$).

The auxiliary current (e.g., the first auxiliary current $I_{AUX1}$) has an effective weight of $2^{m+n+1}$ when it is delivered to the first tap node 113-a, where m is the number of high order bits and n is the number of low order bits. Thus, by adding auxiliary current sources having reducing binary factors in the order of 2, the DAC auxiliary circuit 160 effectively expand the number of least significant bits from which the DAC system 100 may convert. This particular expansion scheme is space efficient as it does not require additional string resistors (e.g., 114-b) to be added to the resistor string 114. Thus, under this expansion scheme, more than two auxiliary bits, and thus more than two auxiliary current sources, can be added to the DAC system 100.

In order to reduce the power consumption of the DAC auxiliary circuit 160, the respective auxiliary current source may be connected to a higher tap node 113 to further reduce the corresponding binary factor. For instance, if the first and second auxiliary current sources 162 and 164 are coupled to the second tap node 113-b, then the respective tap parameter T becomes $2^{-1}$, causing the binary factor of the first auxiliary bit A[0] to be reduced to $2^{-3}$ or a one-eighth fraction and the binary factor of the second auxiliary bit A[1] to be reduced to $2^{-2}$ or a one-fourth fraction. Accordingly, the first auxiliary current ($I_{AUX0}$) can be reduced to one-eighth of the string current ($I_{STRING}$), whereas the second auxiliary current ($I_{AUX1}$) can be reduced to one-fourth of the string current ($I_{STRING}$).

The DAC system 100 anticipates the possibility of encountering DNL errors on the resistor ladder circuit 130. In general, the DNL errors are caused by mismatch between the branch resistance (2R) and the stem resistance (R) associated with one or more high order bits (e.g., D[(n−1):N]). This mismatch is less significant in low resolution DAC systems (e.g., a 8-bit DAC circuit) than in high resolution DAC systems (e.g., a 16-bit DAC circuit). One approach to mitigate the ladder mismatch is by additional trimming resistors in the resistor ladder. This approach however, requires additional layout area and thus may become infeasible in view of stringent design constrains. The DAC system 100 adapts an indirect approach which does not require, though permits, the addition of trimming resistors.

Specifically, the DAC system 100 implements a trimming system that includes a calibration control circuit 144, a trim control circuit 146, and a DAC trim circuit 150. The calibration control circuit 144 is coupled to the DAC output port 105 to detect the DAC output voltage ($V_{DAC}$). The calibration control circuit 144 receives the digital signal 141 from the digital input port 103. The calibration control circuit 144 reconstructs (or reverses the conversion of) the DAC output voltage ($V_{DAC}$) to obtain a calibration digital value and compares it with the digital value (e.g., D[1:N]) of digital signal 141. In the event that there is a mismatch between these two values, the calibration control circuit 144 identifies which of the high order bit(s) is associated with the mismatch. Consequently, the calibration control circuit 144 generates a weight mismatch signal 145 based on the identified high order bit(s). The trim control circuit 146 is coupled with the calibration control circuit 144 to receive the weight mismatch signal 145. Based on the weight mismatch signal 145, the trim control circuit 146 generates one or more trim control signal 147 to indicate one or more trim factor of the identified high order bit(s).

The DAC trim circuit 150 is coupled with the trim control circuit 146 to receive the trim control signal 147. The DAC trim circuit 150 includes a set of one trim current source (e.g., 152 and/or 154) and one trim switch (e.g., 156 and/or 158) for each mismatched high order bit. Thus, to interface with two mismatched high order bits, the DAC trim circuit 150 includes two sets of trim current source (i.e., 152 and/or 154) and trim switch (i.e., 156 and/or 158). The trim current source adjusts the trim current ($I_{TRIM}$) for a particular high order bit according to the trim factor of the respective trim control signal (e.g., C[n], C[n−1] and so on). The trim current ($I_{TRIM}$) may increase or decrease bit weight to the corresponding high order bit so as to compensate the detected mismatch. Effectively, the trim current ($I_{TRIM}$) may be used for trimming the overall impedance of the 2R termination leg, which is implemented by the resistor string circuit 110, to match the impedance of the resistor ladder circuit 130.

For instance, the first trim current source 152 is configured to generate a first trim current ($I_{TRIM1}$) based on a binary fraction (i.e., a first trim factor) of the string current ($I_{STRING}$). This binary fraction is based on the respective trim control signal 147 (e.g., C[N]), and thus it corresponds to an exponential weight mismatch of the Nth high order bit. The first trim current source 152 includes a first trim current output lead 153 to deliver the first trim current ($I_{TRIM1}$). The first trim switch 156 is coupled to the first trim current output lead 153, and it is configured to selectively deliver the first trim current ($I_{TRIM1}$) to the string resistor 114 in response to the corresponding trim control signal 147 (e.g., C[N]). The delivered first trim current ($I_{TRIM1}$) may go through the same selection mechanism provided by the string switch circuit 115. Accordingly, the delivery of the first trim current ($I_{TRIM1}$) supplements the string current ($I_{STRING}$) and is based on the exponential weight mismatch of the Nth high order bit.

Similarly, the second trim current source 154 is configured to generate a second trim current ($I_{TRIM1}$) based on a binary fraction (i.e., a second trim factor) of the string current ($I_{STRING}$). This binary fraction is based on the respective trim control signal 147 (e.g., C[N−1]), and thus it corresponds to an exponential weight mismatch of the N−1th high order bit. The second trim current source 154 includes a second trim current output lead 155 to deliver the second trim current ($I_{TRIM2}$). The second trim switch 158 is coupled to the second trim current output lead 155, and it is configured to selectively deliver the second trim current ($I_{TRIM2}$) to the string resistor 114 in response to the corresponding trim control signal 147 (e.g., C[N−1]). The delivered first trim current ($I_{TRIM1}$) may go through the same selection mechanism provided by the string switch circuit 115. Accordingly, the delivery of the (e.g., C[N−1]) trim current ($I_{TRIM1}$) supplements the string current ($I_{STRING}$) and is based on the exponential weight mismatch of the N−1th high order bit.

Figure 3:
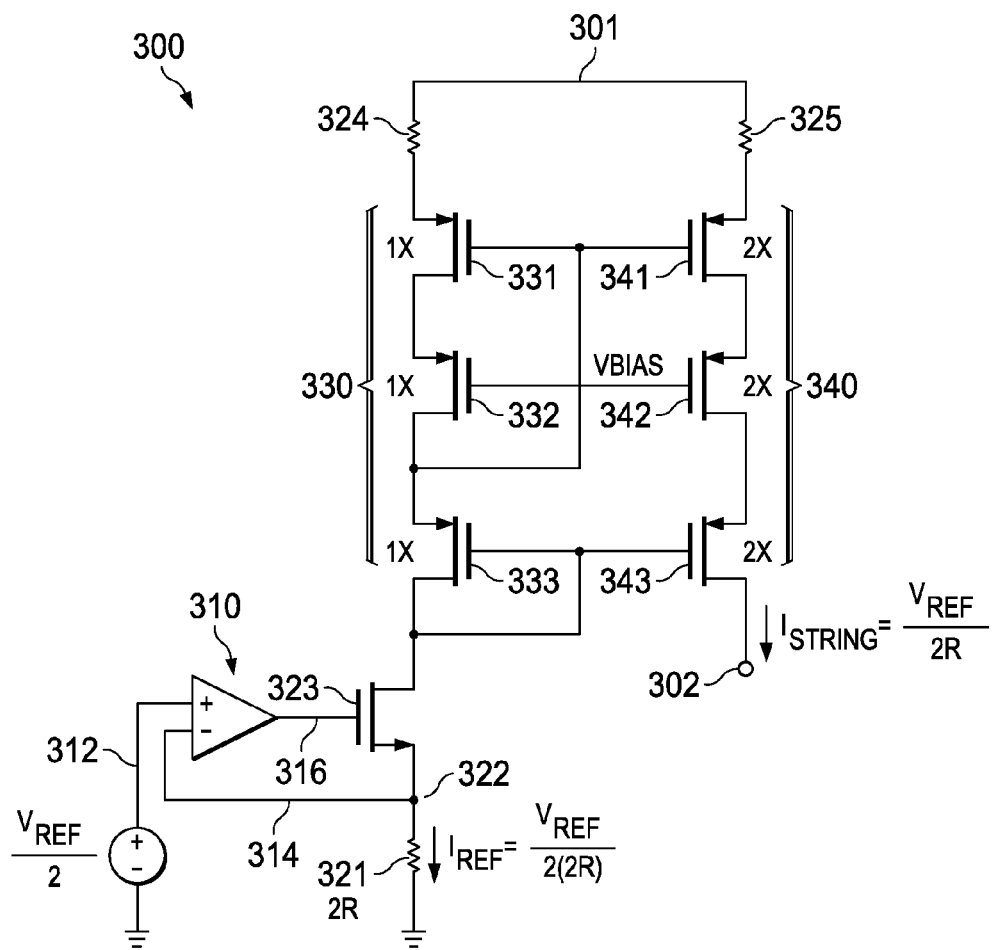
FIG. 3 shows a schematic view of an exemplary current source according to an aspect of the present disclosure.

FIG. 3 shows a schematic view of an exemplary current source 300 according to an aspect of the present disclosure. While the current source 300 provides an exemplary implementation of the string current source 120 as shown and described in FIGS. 1 and 2, the string current source 120 may be implemented by other current sources with similar configurations or other types of current sources. Moreover, the current source 300 may be modified to implement the trim current source (e.g., 152 and/or 154) and the auxiliary current source (e.g., 162 and/or 164).

The current source 300 includes an amplifier 310 with a positive input 312 and a negative input 314. The positive input 312 is configured to receive a voltage substantially equals to half of the reference voltage ($V_{REF}$). The negative input 314 implements a negative feedback path as it is coupled with a source node 322. The amplifier 310 is configured to compare the positive input 312 with the negative input 314. Based on this comparison, the amplifier 310 is configured generate an amplified output 316 that amplifies the difference between the positive input 312 and the negative input 314. In the event that the positive input 312 is greater than the negative input 314, the amplifier 310 increases the amplified output 316. Alternatively, in the event that the positive input 312 is less than the negative input 314, the amplifier 310 decreases the amplified output 316. Effectively, the amplifier 310 serves to maintain a substantially equal potential between the positive input 312 and the negative input 314.

The current source 300 also includes an n-channel transistor 323 with a gate terminal coupled to the amplifier 310. The conductivity of the n-channel transistor 323 is controlled in part by the amplified output 316. Because the amplifier 310 serves to keep the voltage of the source node 322 to be substantially equal to the voltage of the positive input 312, the n-channel transistor 323 is regulated to conduct a reference current ($I_{REF}$) that is based on the reference voltage ($V_{REF}$) and the resistance (2R) of a source resistor 321. More specifically, the amount of reference current ($I_{REF}$) can be preset or adjusted by tuning the reference voltage and/or the source resistor 321. In the configuration of FIG. 3, the reference current ($I_{REF}$) can be expressed by Equation (6).

$$I_{REF} = \frac{V_{REF}}{2(2R)} \qquad \text{Eq. (6)}$$

To achieve the function of current mirroring, the current source 300 includes a reference circuit 330 and a mirror circuit 340. The reference circuit 330 is coupled with a voltage supply (e.g., VDD or VCC) via a first load resistor 324. The reference circuit 330 includes a first reference p-channel transistor 331, a second reference p-channel transistor 332, and a third reference p-channel transistor 313, each of which has a transistor size of 1×. The mirror circuit 340 is coupled with the voltage supply (e.g., VDD or VCC) via a second load resistor 325. The mirror circuit 340 includes a first mirror p-channel transistor 341, a second mirror p-channel transistor 342, and a third mirror p-channel transistor 343, each of which has a transistor size of 2×.

The gate terminal of the first reference p-channel transistor 331 is coupled with the gate terminal of the first mirror p-channel transistor 341 and the source terminal of the second reference p-channel transistor 332. The gate terminal of the second reference p-channel transistor 332 is coupled with the gate terminal of the second mirror p-channel transistor 342, and together, these two gate terminals receive a bias voltage ($V_{BIAS}$) for biasing the reference circuit 330 and the mirror circuit 340. The gate terminal of the third reference p-channel transistor 333 is coupled with the gate terminal of the third mirror p-channel transistor 343. The gate terminal of the third reference p-channel transistor 333 is also diode-connected with the source terminal of the third reference p-channel transistor 333, which is connected to the drain node of the n-channel transistor 323. As a result, the reference circuit 330 is biased to conduct the reference current ($I_{REF}$). Due to the mirror configuration, the mirror circuit 340 is configured to conduct the string current ($I_{STRING}$) that is proportional to the reference current ($I_{REF}$). Because the transistors of the mirror circuit 340 are twice the size as the transistors of the reference circuit 330, the string current ($I_{STRING}$) is two times of the reference current ($I_{REF}$). Thus, the string current ($I_{STRING}$) is regulated at a value that substantially equals $V_{REF}/2R$. The current source 300 includes an output lead 302 to deliver the string current ($I_{STRING}$).

The relative transistor size between the reference circuit 330 and the mirror circuit 340 can be adjusted depending on the power consumption requirement and/or output current adjustment. For instance, in a configuration where the current source 300 is used for implementing the auxiliary current source (e.g., the second auxiliary current source 162), which is at a binary fraction of the string current ($I_{STRING}$), the transistors of the mirror circuit 340 can be sized down by the binary fraction (e.g., from 2× to 1× according to a binary fraction of 2). Moreover, the source resistor 321 may be adjusted according to the configuration of the resistor string circuit 110 as shown and described in FIG. 1. For instance, the resistance of the source resistor 321 may be changed to the total string resistance ($R_{STRING}$) when the string resistors 114 each has a resistance that deviates from the unit resistance of $R*2^{-(n-1)}$.

The present disclosure provides several implementations of the hybrid DAC architecture. These implementations allow a DAC circuit to occupy small layout area by reducing the size of the R2R ladder and simplifying the output stage of the resistor string. Moreover, the optional trim feature and auxiliary conversion feature provides additional reliability and versatility to the hybrid DAC architecture. Thus, an integrated circuit may implement multiple DAC channels by using the disclosed hybrid DAC architecture. For instance, an integrated circuit may include four DAC circuits (e.g., the DAC system 100) to implement four DAC channels.

A few embodiments have been described in detail above, and various modifications are possible. The disclosed subject matter, including the functional operations described in this specification, can be implemented in electronic circuitry, computer hardware, firmware, software, or in combinations of them, such as the structural means disclosed in this specification and structural equivalents thereof, including potentially a program operable to cause one or more data processing apparatus to perform the methods and/or operations described (such as a program encoded in a computer-readable medium, which can be a memory device, a storage device, a machine-readable storage substrate, or other physical, machine-readable medium, or a combination of one or more of them).

Consistent with the present disclosure, the term "configured to" purports to describe the structural and functional characteristics of one or more tangible non-transitory components. For example, the term "configured to" can be understood as having a particular configuration that is designed or dedicated for performing a certain function. Within this understanding, a device is "configured to" perform a certain function if such a device includes tangible non-transitory components that can be enabled, activated, or powered to perform that certain function. While the term "configured to" may encompass the notion of being configurable, this term should not be limited to such a narrow definition. Thus, when used for describing a device, the term "configured to" does not require the described device to be configurable at any given point of time.

Consistent with the present disclosure, the terms "substantially equal to" and "substantially equal" as applied to features of an integrated circuit is understood to mean equal within fabrication tolerances used to form the integrated circuit. More specifically, the terms "substantially equal to" and "substantially equals" purport to describe a quantitative relationship between two objects. This quantitative relationship may prefer the two objects to be equal by design but with the anticipation that a certain amount of variations can be introduced by the fabrication process. In one aspect, a first resistor may have a first resistance that is substantially equal to a second resistance of the second resistor where the first and second resistors are purported to have the same resistance yet the fabrication process introduces slight variations between the first resistance and the second resistance. Thus, the first resistance can be substantially equal to the second resistance even when the fabricated first and second resistors demonstrate slight difference in resistance. This slight difference may be within 5% of the design target. In another aspect, a first resistor may have a first resistance that is substantially equal to a second resistance of a second resistor where the process variations are known a priori, such that the first resistance and the second resistance can be preset at slightly different values to account for the known process variations. Thus, the first resistance can be substantially equal to the second resistance even when the design values of the first and second resistance are preset to include a slight difference to account for the known process variations. This slight difference may be within 5% of the design target.

A program (also known as a computer program, software, software application, script, or code) can be written in any form of programming language, including compiled or interpreted languages, or declarative or procedural languages, and it can be deployed in any form, including as a standalone program or as a module, component, subroutine, or other unit suitable for use in a computing environment. A program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A program can be deployed to be executed on one computer or on multiple computers that are located at one site or distributed across multiple sites and interconnected by a communication network.

While this specification contains many specifics, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results unless such order is recited in one or more claims. In certain circumstances, multitasking and parallel processing may be advantageous. Moreover, the separation of various system components in the embodiments described above should not be understood as requiring such separation in all embodiments.

What is claimed is:

1. A digital-to-analog conversion (DAC) circuit comprising:
    a string current source configured to generate a string current based on a ratio of a reference voltage divided by a predetermined resistance, the string current source having a string current output lead to deliver the string current;
    a resistor string having a string resistor coupled across a high string node and a low string node, the string resistor having a string resistance based on the predetermined resistance;
    a string switch circuit coupled to the string current output lead, the string switch circuit configured to selectively deliver the string current to the string resistor based on a digital input signal; and
    a bridge resistor coupled between the high string node of the resistor string and a string output node outside of the resistor string, the bridge resistor having a bridge resistance based on the string resistance.

2. The DAC circuit of claim 1, wherein:
    the digital input signal includes high order bits and low order bits; and
    the string switch circuit coupled the string current output lead to a selected tap node of the resistor string based on a value decoded from the low order bits of the digital input signal.

3. The DAC circuit of claim 2, wherein:
    the selected tap node divides the string resistor into a selected segment between the selected tap node and the low string node and an unselected segment between the high string node and the selected tap node;

the string current from the string current source is configured to diverge at the selected tap node into a low order current and a high order current;

the low order current is configured to flow through the selected segment of the string resistor; and the high order current configured to flow through the unselected segment of the string resistor.

4. The DAC circuit of claim 3, wherein the string output node is configured to establish a string voltage based on a multiplication product between the string current and the selected segment of the string resistor.

5. The DAC circuit of claim 2, further comprising:

a resistor ladder coupled to the string output node, the resistor ladder having a stem resistor and a branch resistor, the branch resistor having a branch resistance based on a sum of the string resistance and the bridge resistance, and the stem resistor having a stem resistance substantially equal to half of the branch resistance; and a ladder switch circuit coupled with the branch resistor of the resistor ladder, the ladder switch circuit controlled by the high order bits of the digital input signal to selectively connect the branch resistor to either the reference voltage or a ground voltage.

6. The DAC circuit of claim 5, further comprising:

an output node configured to deliver a DAC output voltage based on the reference voltage divided by a binary exponentiation of a total bit number of the high order bits and the low order bits.

7. The DAC circuit of claim 5, further comprising:

a trim current source configured to generate a trim current based on a binary fraction of the string current and corresponding to an exponential weight mismatch of one of the high order bits, the trim current source having a trim current output lead to deliver the trim current.

8. The DAC circuit of claim 7, further comprising:

a trim switch circuit coupled to the trim current output lead, the trim switch circuit configured to selectively deliver the trim current to the string resistor based on the exponential weight mismatch.

9. The DAC circuit of claim 2, further comprising:

an auxiliary current source configured to generate an auxiliary current based on a binary fraction of the string current and corresponding to an exponential weight of one of the low order bits, the auxiliary current source having an auxiliary current output lead to deliver the auxiliary current.

10. The DAC circuit of claim 9, further comprising:

an auxiliary switch coupled between the auxiliary current output lead and a tap node of the resistor string, the auxiliary switch controlled by the one of the low order bits to selectively deliver the auxiliary current to the string resistor.

11. The DAC circuit of claim 5, wherein the predetermined resistance substantially equals the string resistance.

12. The DAC circuit of claim 5, wherein the predetermined resistance substantially equals the sum of the string resistance and the bridge resistance.

13. A digital-to-analog conversion (DAC) circuit comprising:

an input configured to receive a digital signal having high order bits and low order bits;

a resistor ladder circuit controlled by the high order bits, and including a stem resistor and a branch resistor, the stem resistor having a stem resistance, and the branch resistor having a branch resistance substantially equal to two times of the stem resistance; and a resistor string circuit controlled by the low order bits, and including:

a string current source configured to generate a string current based on a ratio of a reference voltage divided by a predetermined resistance;

a string resistor having a string resistance corresponding to the predetermined resistance, the string resistor configured to selectively receive the string current based on a selection signal decoded from the low order bits; and a bridge resistor coupled between the string resistor and the stem resistor, the bridge resistor having a bridge resistance based on the string resistance and the predetermined resistance.

14. The DAC circuit of claim 13, wherein the predetermined resistance substantially equals the string resistance.

15. The DAC circuit of claim 13, wherein the predetermined resistance substantially equals the sum of the string resistance and the bridge resistance.

16. The DAC circuit of claim 13, wherein the branch resistance substantially equals a sum of the string resistance and the bridge resistance.

17. A digital-to-analog conversion (DAC) circuit comprising:

an input configured to receive a digital signal having m high order bits and n low order bits where m includes a first positive integer and n includes a second positive integer;

a resistor ladder circuit controlled by the high order bits, and including a stem resistor and a branch resistor, the stem resistor having a stem resistance, and the branch resistor having a branch resistance substantially equal to two times of the stem resistance; and a resistor string circuit controlled by the low order bits, and including:

a string current source configured to generate a string current based on a ratio of a reference voltage divided by the branch resistance; and a resistor string having $2^n$ tap nodes and $2^n-1$ string resistors coupled between successive tap nodes, each string resistor having a unit resistance substantially equal to a $\frac{1}{2^n}$ fraction of the branch resistance; and a string switch circuit configured to selectively deliver the string current to one of the tap nodes based on a decoded value of the low order bits.

18. The DAC circuit of claim 17, further comprising:

an output node configured to deliver a DAC output voltage based on the reference voltage divided by a binary exponentiation of a sum of m and n.

19. The DAC circuit of claim 17, further comprising:

a trim current source configured to generate a trim current based on a binary fraction of the string current and corresponding to an exponential weight mismatch of one of the high order bits.

20. The DAC circuit of claim 17, further comprising:

an auxiliary current source configured to generate an auxiliary current based on a binary fraction of the string current and corresponding to an exponential weight of one of the low order bits.

* * * * *